United States Patent
Shinomiya

(10) Patent No.: US 10,218,351 B2
(45) Date of Patent: Feb. 26, 2019

(54) PARALLEL DRIVING CIRCUIT OF VOLTAGE-DRIVEN TYPE SEMICONDUCTOR ELEMENT

(71) Applicant: DENSO CORPORATION, Kariya, Aichi-pref. (JP)

(72) Inventor: Kouhei Shinomiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/954,927

(22) Filed: Apr. 17, 2018

(65) Prior Publication Data

US 2018/0302082 A1    Oct. 18, 2018

(30) Foreign Application Priority Data

Apr. 18, 2017  (JP) .................. 2017-082003

(51) Int. Cl.
*H03B 1/00* (2006.01)
*H03K 3/00* (2006.01)
*H03K 17/30* (2006.01)

(52) U.S. Cl.
CPC .................. *H03K 17/30* (2013.01)

(58) Field of Classification Search
CPC ....... H03K 19/00361; H03K 19/00384; H03K 19/00315; H04L 25/028; H04L 25/0272
USPC .................. 327/108, 109, 112, 427
See application file for complete search history.

(56) References Cited

U.S. PATENT DOCUMENTS

| | | | | |
|---|---|---|---|---|
| 7,230,587 | B2 * | 6/2007 | Onozawa | G09G 3/296 |
| | | | | 315/169.3 |
| 9,787,301 | B2 * | 10/2017 | Sato | H03K 17/567 |
| 2008/0122497 | A1 | 5/2008 | Ishikawa et al. | |
| 2011/0156628 | A1 * | 6/2011 | Summer | H03K 17/22 |
| | | | | 318/400.28 |
| 2012/0018741 | A1 | 1/2012 | Sato | |
| 2012/0326646 | A1 | 12/2012 | Tanaka et al. | |
| 2013/0062626 | A1 | 3/2013 | Takao et al. | |
| 2013/0155745 | A1 * | 6/2013 | Tanaka | H02M 7/003 |
| | | | | 363/131 |
| 2017/0302152 | A1 * | 10/2017 | Watanabe | H02M 1/088 |

FOREIGN PATENT DOCUMENTS

| | | |
|---|---|---|
| JP | H04-354156 A | 12/1992 |
| JP | H05-090933 A | 4/1993 |
| JP | 2000-197206 A | 7/2000 |
| JP | 2002-016486 A | 1/2002 |
| JP | 2002-165439 A | 6/2002 |
| JP | 2005-295653 A | 10/2005 |
| JP | 2006-020405 A | 1/2006 |
| JP | 2010-279193 A | 12/2010 |
| JP | 2011-146686 A | 7/2011 |

(Continued)

*Primary Examiner* — Anh Q Tra
(74) *Attorney, Agent, or Firm* — Oliff PLC

(57) ABSTRACT

A PCH driving section of a gate driving circuit applies a high level driving voltage that can be changed by a high side pre-driver to a gate of a P-channel MOSFET connected between a high potential side terminal and a high side driving terminal. An NCH driving section applies a low level driving voltage to a gate of an N-channel MOSFET connected between a low side driving terminal and a low potential side terminal using a low side pre-driver. The low potential side terminal is provided separately from a ground terminal.

4 Claims, 4 Drawing Sheets

(56) References Cited

FOREIGN PATENT DOCUMENTS

| JP | 2012-253202 A | 12/2012 |
|----|---------------|---------|
| JP | 2013-017007 A | 1/2013  |
| JP | 2013-125889 A | 6/2013  |
| JP | 2013-131774 A | 7/2013  |

* cited by examiner

PARALLEL DRIVING CIRCUIT OF VOLTAGE-DRIVEN TYPE SEMICONDUCTOR ELEMENT

CROSS-REFERENCE TO RELATED APPLICATION

This application is based on and claims the benefit of priority from earlier Japanese Patent Applications No. 2017-82003 filed Apr. 18, 2017, the descriptions of which are incorporated herein by references.

TECHNICAL FIELD

The present invention relates to a parallel driving circuit of a plurality of voltage-driven type semiconductor elements.

BACKGROUND

Japanese Patent Application Laid-Open Publication No. 2013-59190 (Patent Document 1) discloses a power semiconductor module in which a SiC (silicon carbide)-MOSFET which is a wide band gap semiconductor switching element and a Si-IGBT are connected in parallel, of which a chip area of the former is configured to be smaller than that of the latter.

Patent Document 1 also discloses a gate driving circuit of the power semiconductor module.

However, Patent Document 1 only explains how to set the turn-on and turn-off timings of the parallel elements of the above gate driving circuit.

In some cases, the optimum driving voltage is different between the SiC-MOSFET and the Si-IGBT, however, this fact is not mentioned in Patent Document 1, and driving voltages of both are set to be equal.

For example, an on-voltage for the SiC-MOSFET may be set higher than that of the Si-IGBT in order to take advantage of the characteristic that the on-resistance is low.

Further, since a threshold voltage of the SiC-MOSFET is low, an off-voltage may be set to a negative potential to prevent erroneous turn-on in an off state.

Therefore, in a case of using the gate driving circuit disclosed in Patent Document 1, it is impossible to sufficiently obtain a loss reduction effect obtained by driving the SiC-MOSFET and the Si-IGBT in parallel.

In addition, if the gate driving circuits corresponding respectively to the SiC-MOSFET and the Si-IGBT are prepared, a respective dedicated drive IC is required so that a mounting area on a circuit board is increased and the cost is increased.

SUMMARY

An embodiment provides a parallel driving circuit of a voltage-driven type semiconductor element with high general versatility capable of driving a plurality of elements in a flexible form.

One aspect of the present disclosure is a parallel driving circuit, a voltage-driven type semiconductor element of which is to be driven.

The parallel driving circuit includes a high level driving section having a high side switching element connected between a high potential side terminal and a high side driving terminal, and a high side pre-driver capable of changing a high level driving voltage applied to a conduction control terminal of the high side switching element.

The parallel driving circuit further includes a low level driving section having a low side switching element connected between a low side driving terminal and a low potential side terminal, and a low side driving section having a low side pre-driver which applies a low level driving voltage to a conduction control terminal of the low side switching element.

The parallel driving circuit further includes a binary level driving section having the high level driving section and the low level driving section, and the low potential side terminal being provided separately from a ground terminal.

The parallel driving circuit further includes a drive signal generating section that generates drive signals to be outputted respectively to the high side driving section and the low side driving section according to an inputted drive control signal.

The parallel driving circuit is provided with a plurality of the binary level driving sections.

When configured as described above, and by connecting the high side and low side driving terminals to the conduction control terminal of the voltage-driven type semiconductor element to be driven, a high level driving voltage adjusted based on the voltage supplied to the high potential side terminal can be applied by turning on the high side switching element.

Therefore, an appropriate voltage can be applied according to the type of the semiconductor element to be driven.

Further, by turning on the low side switching element, a voltage supplied to the low potential side terminal can be applied as the low level driving voltage to the conduction control terminal of the voltage-driven type semiconductor element.

At this time, since the low potential side terminal is independent from the ground terminal, not only the ground potential but also a negative voltage, for example, can be supplied as the low level driving voltage.

Then, since a plurality of binary level driving units each including a high level driving section and a low level driving section are provided, when driving a plurality of types of voltage-driven semiconductor elements in parallel, high level and low level driving voltages appropriate for each type can be applied.

Thus, it is possible to fully enjoy the merit of driving the plurality of voltage-driven semiconductor elements in parallel.

In addition, since it is unnecessary to provide a dedicated driving circuit corresponding to the type of the semiconductor element, versatility can be enhanced.

BRIEF DESCRIPTION OF THE DRAWINGS

In the accompanying drawings:

FIG. 2 shows a circuit diagram in a state where connections of the Si-IGBT and the SiC-MOSFET to the gate driving circuit are switched on;

FIG. 4 shows a circuit diagram in a state where connections of the Si-IGBT and the SiC-MOSFET to the gate driving circuit are switched on.

DETAILED DESCRIPTION OF THE PREFERRED EMBODIMENTS

First Embodiment

Figure 1:
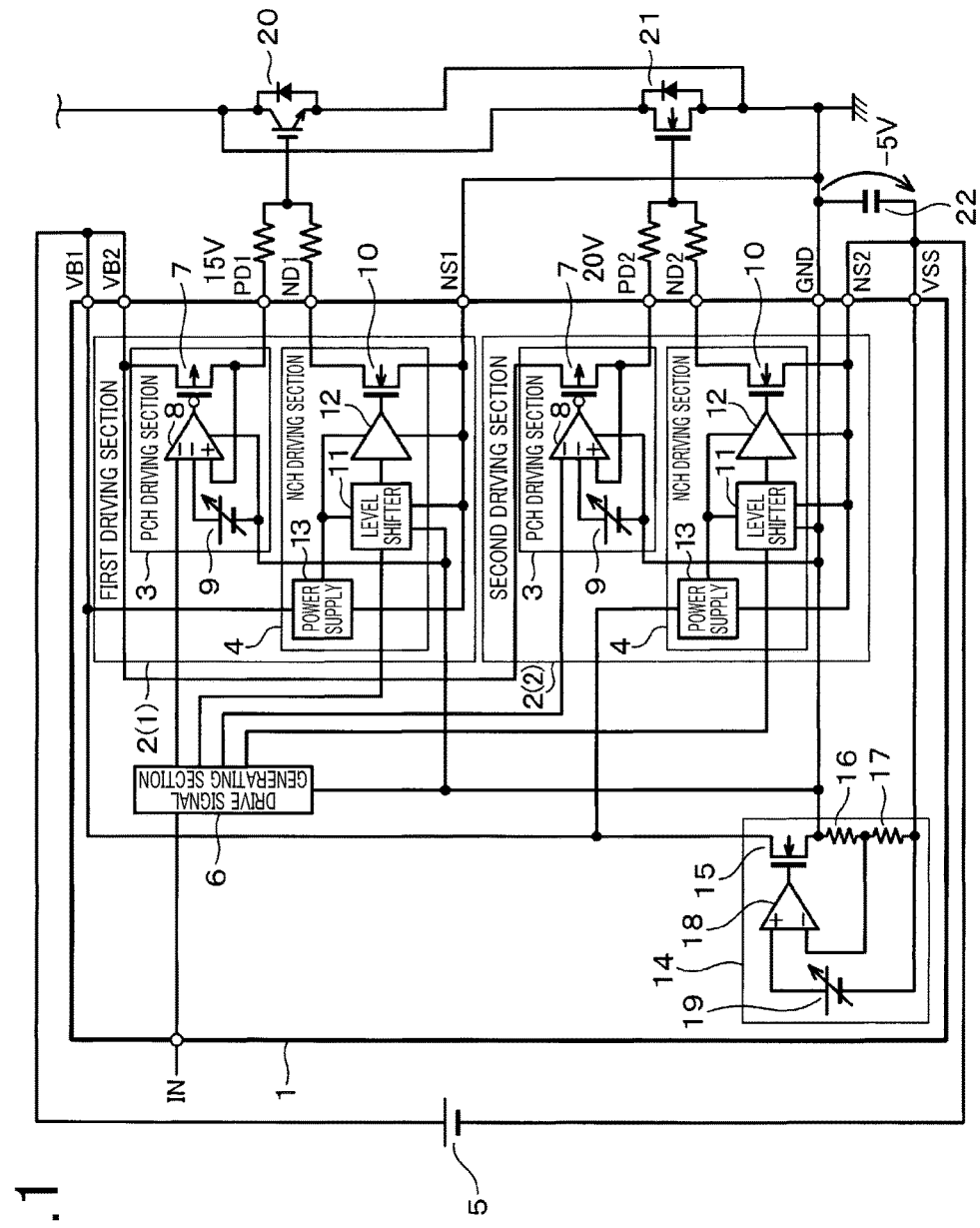
FIG. 1 shows a circuit diagram of a state where a Si-IGBT and a SiC-MOSFET are connected to a gate driving circuit according to a first embodiment.

As shown in FIG. 1, a gate driving circuit 1 of the present embodiment includes a first driving section 2(1) and a second driving section 2(2).

Each driving section 2 has a PCH driving section 3 and an NCH driving section 4.

The gate driving circuit 1 has a signal input terminal IN, two power supply terminals VB1 and VB2, and a ground terminal GND.

Further, the gate driving circuit 1 has a high side driving terminal PD1, a low side driving terminal ND1, and a low potential side terminal NS1 connected to the first driving section 2(1), and a high side driving terminal PD2, a low side driving terminal ND2, and a low potential side terminal NS2 connected to the second driving section 2(2).

The low potential side terminal NS1 is connected to the ground terminal GND outside the gate driving circuit 1.

Furthermore, the gate driving circuit 1 is provided with a negative voltage supply terminal VSS.

The power supply terminals VB1 and VB2 are connected to a positive side terminal of an external DC power supply 5, and the low side driving terminal ND2 and the negative voltage supply terminal VSS are connected in common to a negative side terminal of the DC power supply 5.

The ground terminal GND is set to 0V which is a ground potential.

A drive control signal is applied to the signal input terminal IN from the outside, and the drive control signal is inputted to a drive signal generating section 6.

The drive signal generating section 6 inputs drive control signals respectively corresponding to the PCH driving section 3 and the NCH driving section 4 based on the drive control signal.

The first drive section 2(1) and the second drive section 2(2) are configured symmetrically, and the first drive section 2(1) will be described below.

The PCH driving section 3 includes a P-channel MOSFET 7 of which a source is connected to the power supply terminal VB2 and a drain is connected to the high side driving terminal PD1.

An output terminal of a high side pre-driver 8 is connected to a gate of the MOSFET 7.

The gate corresponds to a conduction control terminal.

The drive control signal from the drive signal generating section 6 is inputted to an inverting input terminal of the pre-driver 8.

A positive side terminal of a variable voltage source 9 is connected to a reference voltage input terminal of the pre-driver 8 indicated by the same symbol as the inverting input terminal.

A non-inverting input terminal of the pre-driver 8 is connected to the drain of the MOSFET 7.

A negative side terminal of the pre-driver 8 and the negative side terminal of the variable voltage source 9 are connected to the ground terminal GND.

The NCH driving section 4 includes an N-channel MOSFET 10 of which a drain is connected to the low side driving terminal ND1 and a source is connected to the low potential side terminal NS1.

A drive control signal from the drive signal generating section 6 is applied to a gate of the MOSFET 10 via a level shifter 11 and a low side pre-driver 12.

A positive side terminal of the driving power supply 13 is connected to the power supply terminal VB1, and a negative side terminal thereof is connected to the low potential side terminal NS1.

The driving power supply 13 generates a high-level driving voltage to be applied to the gate of the MOSFET 10 and supplies it to the level shifter 11 and the low side pre-driver 12.

A negative side input terminal of the level shifter 11 is connected to the ground terminal GND inside the gate driving circuit 1, and a negative side output terminal of the level shifter 11 and a negative side terminal of the pre-driver 12 are connected to the low potential side terminal NS1.

In addition, the gate driving circuit 1 includes a negative power supply circuit 14.

The negative power supply circuit 14 includes a series circuit of an N-channel MOSFET 15, resistance elements 16 and 17, and an operational amplifier 18 connected between the power supply terminal VB1 and a negative voltage supply terminal VSS.

A positive side terminal of a variable voltage source 19 is connected to a non-inverting input terminal of the operational amplifier 18, and a negative side terminal of the variable voltage source 19 is connected to the negative voltage supply terminal VSS.

An inverting input terminal of the operational amplifier is connected to a common connection point of the resistance elements 16 and 17, and an output terminal of the operational amplifier 18 is connected to a gate of the MOSFET 15.

A source of the MOSFET 15 is connected to the ground terminal GND.

The high side driving terminal PD1 and the low side driving terminal ND1 of the gate driving circuit 1 are connected to a gate of a Si-IGBT 20 via gate resistors, respectively.

In addition, the high side driving terminal PD2 and the low side driving terminal ND2 are connected to a gate of a SiC-MOSFET 21 via gate resistors, respectively.

A collector of the IGBT 20 is connected to a drain of the SiC-MOSFET 21, and a drive power source (not shown) is supplied thereto.

Further, an emitter of the IGBT 20 is connected to the ground terminal GND of the gate driving circuit 1 together with a source of the SiC-MOSFET 21.

Then, a capacitor 22 is connected between the ground terminal GND and the negative voltage supply terminal VSS.

It should be noted that the negative side input terminal of the level shifter 11 on the drive section 2(2) side is connected to the ground terminal GND, and the negative side output terminal thereof is connected to the negative voltage supply terminal VSS via the low potential side terminal NS2.

Here, the MOSFET 7 corresponds to a high side switching element and the MOSFET 10 corresponds to a low side switching element.

Further, the driving section 2 corresponds to a binary level driving section, the PCH driving section 3 corresponds to a high level driving section, and the NCH driving section 4 corresponds to a low level driving section.

In addition, the IGBT 20 and the MOSFET 21 correspond to voltage-driven semiconductor elements.

The gate driving circuit 1 corresponds to a parallel driving circuit.

Next, a function of the present embodiment will be described.

An example of each potential setting when the IGBT 20 and the MOSFET 21 are driven in parallel in the above connection mode is shown.

The voltage supplied from the DC power supply 5 is assumed to be 25V, for example.

In the PCH drive section 3 of the first drive section 2(1), a reference voltage of the variable voltage source 9 is adjusted so that the high level driving voltage applied to the gate of the IGBT 20 becomes 15V when the MOSFET 7 is turned on.

Further, in the PCH driving section 3 of the second driving section 2(2), a reference voltage of the variable voltage source 9 is adjusted so that the high level driving voltage applied to the gate of the MOSFET 21 becomes 20V when the MOSFET 7 is turned on.

In the negative power supply circuit 14, a reference voltage of the variable voltage source 19 is adjusted so that the potential of the negative voltage supply terminal VSS becomes −5V with respect to the potential of the ground terminal GND.

The binary level driving voltages applied to the gates of the IGBT 20 and the MOSFET 21 become as follows by setting as described above.

|  | High level driving voltage | Low level driving voltage |
| --- | --- | --- |
| IGBT 20 | 15 V | 0 V |
| MOSFET 21 | 20 V | −5 V |

In this manner, power consumption can be reduced by making use of the characteristic of low on-resistance by setting the high-level driving voltage of the MOSFET 21 higher than that of the IGBT 20.

Further, it is possible to prevent erroneous ON state by being influenced by noise etc. from occurring in an OFF state by setting the low-level driving voltage of the MOSFET 21 to a negative voltage.

Figure 2:
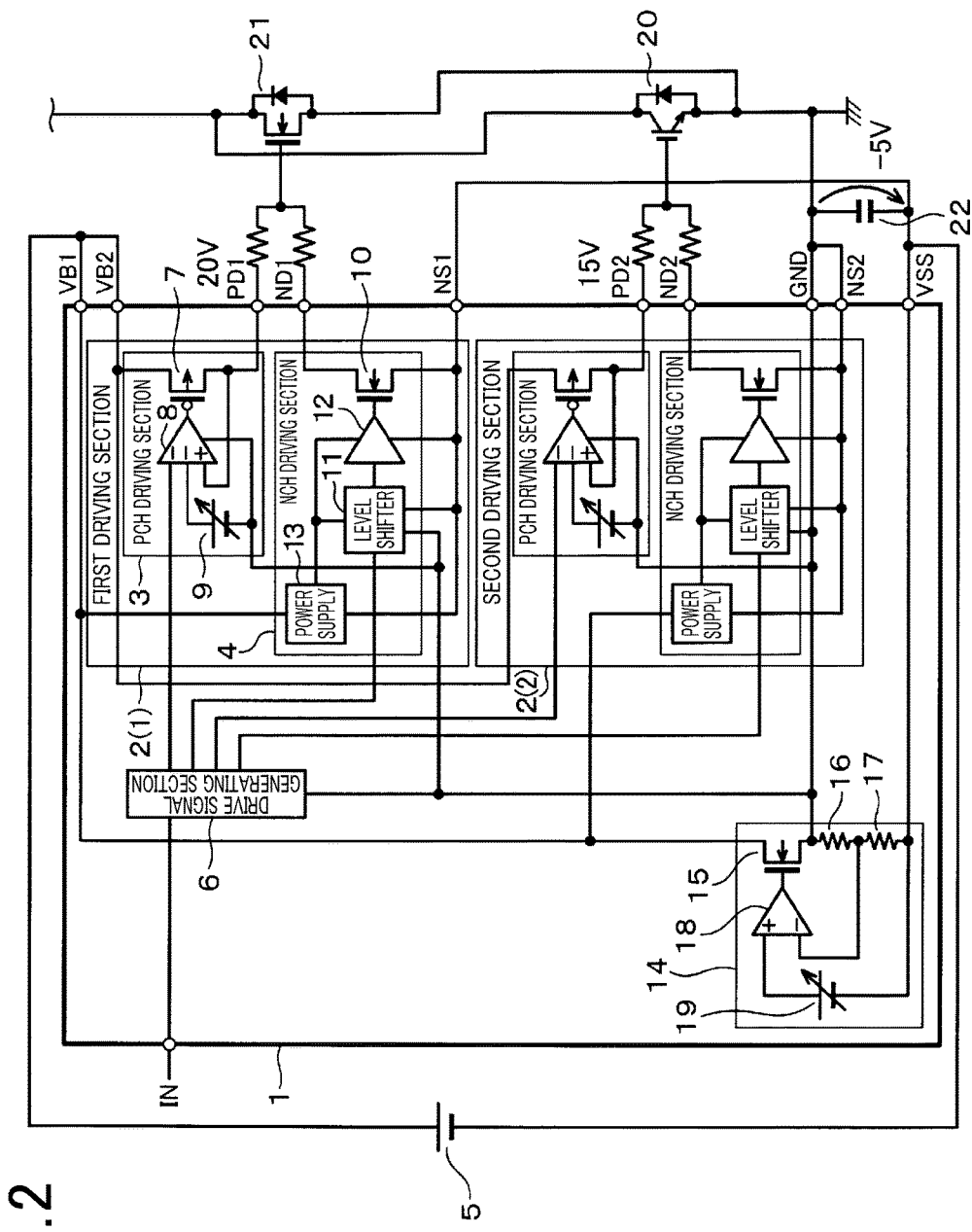

FIG. 2 shows a case where the MOSFET 21 is connected to the first drive section 2(1) and the IGBT 20 is connected to the second drive section 2(2).

At this time, the high-level driving voltage applied by the PCH driving unit 3 of the first driving unit 2(1) is set to 20V, and the high-level driving voltage applied by the PCH driving unit 3 of the second driving unit 2(2) is set to 15V.

Then, the low potential side terminal NS1 is connected to the negative voltage supply terminal VSS, and the low potential side terminal NS2 is connected to the ground terminal GND.

Even if the connection relationship of the IGBT 20 and the MOSFET 21 is switched in this manner, it is possible to cope with this by adjusting the voltage setting of each part accordingly and by changing the connection state of an external terminal of the gate driving circuit 1.

As described above, according to the present embodiment, the PCH driving section 3 of the gate driving circuit 1 applies a high level driving voltage that can be changed by the high side pre-driver 8 to the gate of the P-channel MOSFET 7 connected between the high potential side terminal VB2 and the high side driving terminal PD.

The NCH driving section 4 applies a low-level driving voltage to the gate of the N-channel MOSFET 10 connected between the low side driving terminal ND and the low potential side terminal NS by the low side pre-driver 12.

The low potential side terminal NS is provided separately from the ground terminal GND.

Then, the first drive section 2(1) and the second drive section 2(2) are provided, the high side driving terminal PD1 and the low side driving terminal ND1 of the first drive section 2(1) are connected to the gate of the IGBT 20, and the high side driving terminal PD2 and the low side driving terminal ND2 of the second driving unit 2(2) are connected to the gate of the MOSFET 21.

Thus, a high level driving voltage, adjusted based on the voltage supplied to the high potential side terminal VB2, can be applied to the respective gates by turning on the MOSFET 7.

Since the high-level driving voltage can be changed by the pre-driver 8, it is possible to apply an appropriate voltage according to the type of the semiconductor element to be driven.

Further, the voltages supplied to the low potential side terminals NS1 and NS2 can be applied to the gates of the IGBT 20 and the MOSFET 21 as low level driving voltages, respectively, by turning on the MOSFET 10.

At this time, since the low potential side terminal NS is independent from the ground terminal GND, not only the ground potential but also a negative voltage, for example, can be supplied as the low level driving voltage.

That is, when the IGBT 20 and the MOSFET 21 connected in parallel are driven, high level and low level driving voltages appropriate for each type can be applied.

Thereby, it is possible to fully enjoy the merit of driving the IGBT 20 and the MOSFET 21 in parallel.

In addition, since it is unnecessary to provide a dedicated driving circuit according to the type of the semiconductor element to be driven, versatility can be enhanced.

Further, the level shifter 11 is provided in the NCH driving section 4, and the driving power supply 13 supplies the power supply voltage generated with reference to the potential of the low potential side terminal NS to the level shifter 11 and the low side pre-driver 12.

Thereby, when the negative voltage is supplied as the low level driving voltage, the level of the drive signal inputted from the drive signal generating section 6 can be shifted to a negative voltage and outputted.

In addition, the negative power supply circuit 14 is provided in the gate driving circuit 1 so that the negative voltage generated by the negative power supply circuit 14 is supplied to the negative voltage supply terminal VSS.

As a result, regardless of whether the MOSFET 21 is driven by any of the driving sections NS2(1) and ND2(2), the MOSFET 21 can be driven by replacing the connections between the low potential side terminals NS1 and NS2, and between the ground terminal GND and the negative voltage supply terminal VSS outside the gate driving circuit 1.

Further, since the negative power supply circuit 14 is configured to be capable of changing the negative voltage level, it is possible to set an appropriate negative voltage according to the type of the semiconductor element to be driven.

Second Embodiment

In the following embodiment, the same elements as those in the first embodiment are denoted by the same reference numerals, and a description thereof will be omitted and only different elements will be described.

Figure 3:
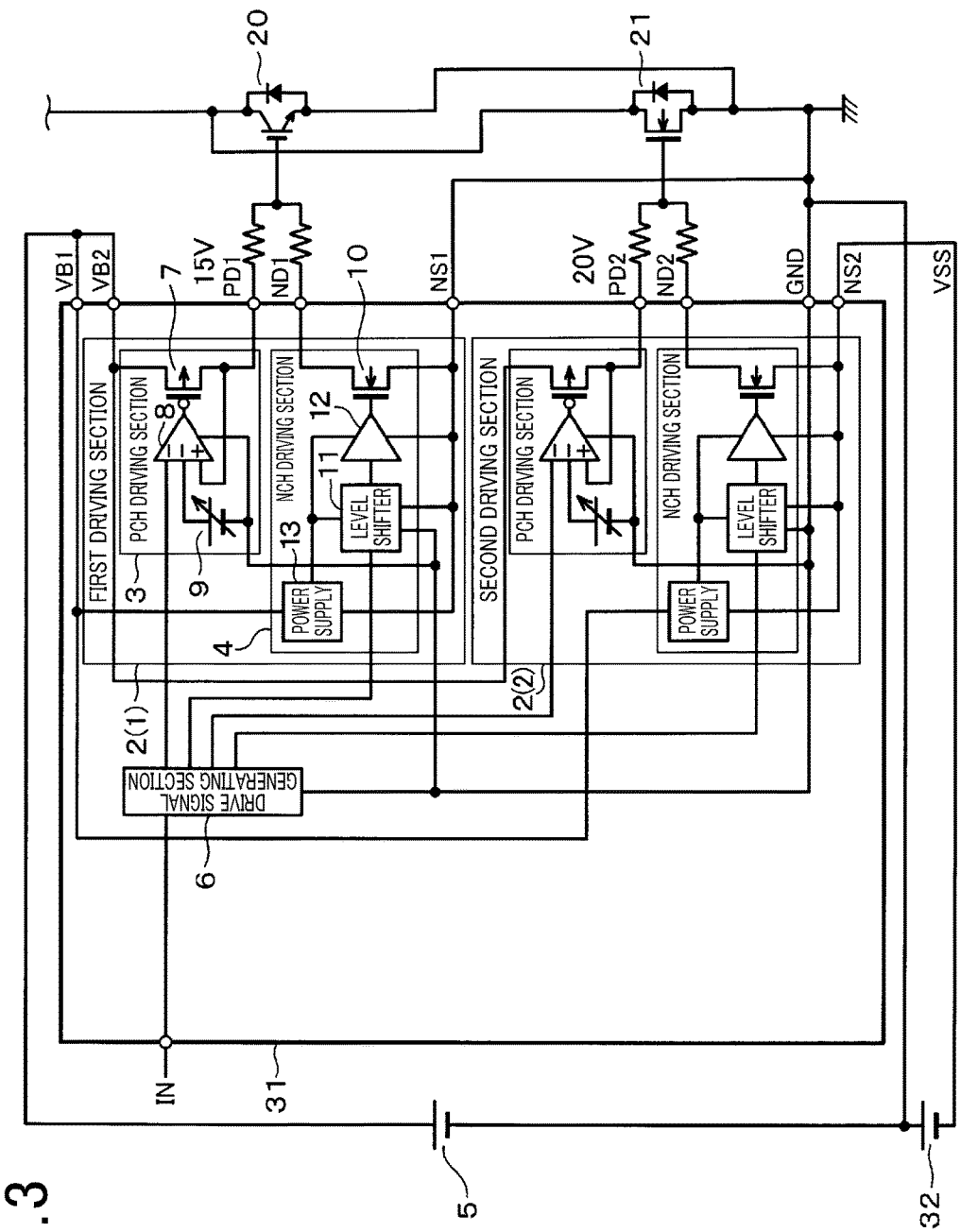
FIG. 3 shows a circuit diagram of a state where a Si-IGBT and a SiC-MOSFET are connected to a gate driving circuit according to a second embodiment.

As shown in FIG. 3, a gate driving circuit 31 of a second embodiment is obtained by eliminating the negative power supply circuit 14 and the negative voltage supply terminal VSS from the gate driving circuit 1 of the first embodiment.

Outside the gate driving circuit 31, a 5V DC power supply 32 is connected in series to a DC power supply 5, and a negative side terminal of the DC power supply 32 is connected to a low potential side terminal NS2 of a second drive section 2(2).

In this way, −5V can be supplied to a low side driving terminal ND2 as a low level driving voltage similarly ton the first embodiment by supplying the negative voltage by the external DC power supply 32.

Figure 4:
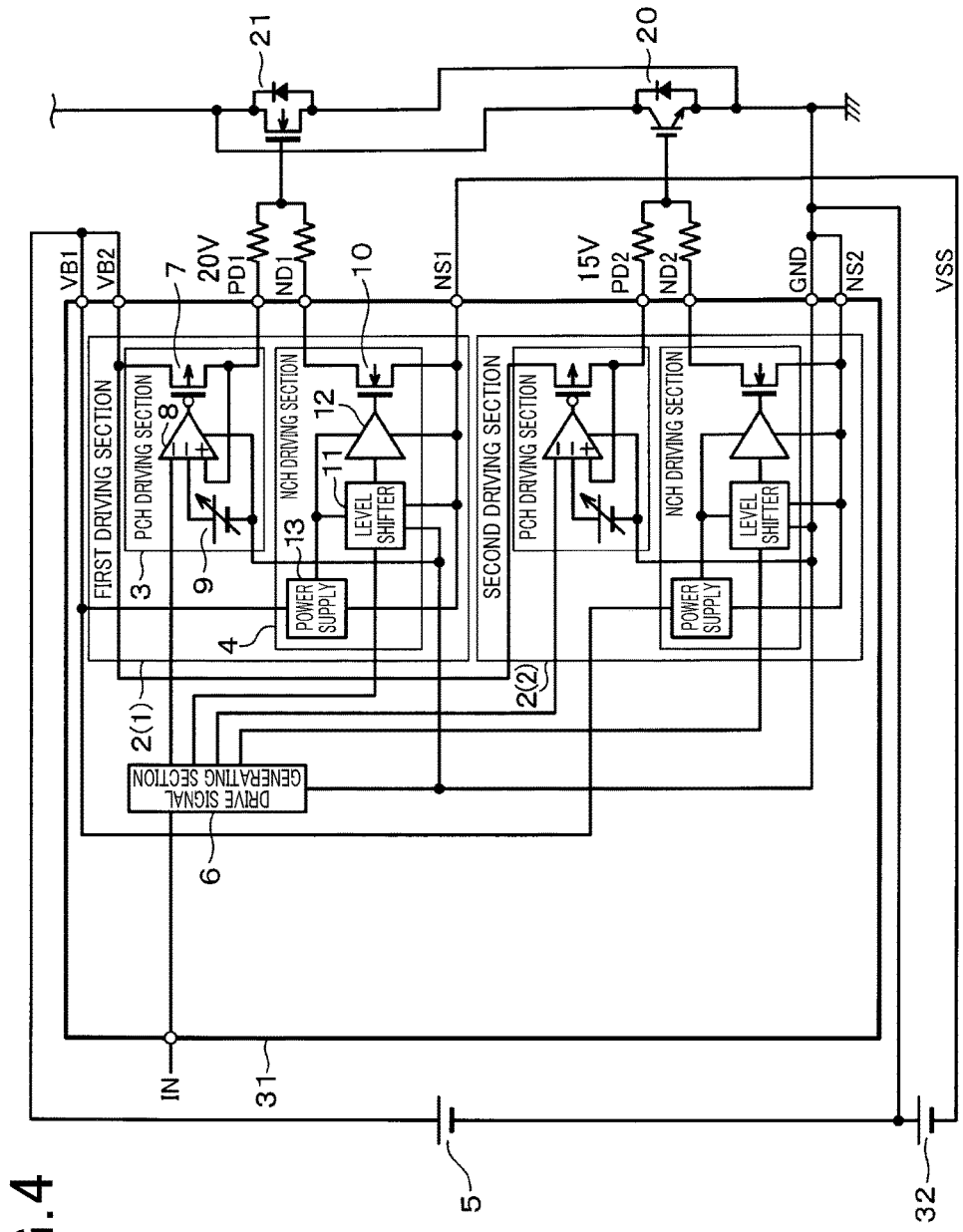

Further, FIG. 4 shows a case where the connection relationship of an IGBT 20 and a MOSFET 21 with respect to the gate driving circuit 31 is switched, similarly to the case shown in FIG. 2 of the first embodiment.

Even in this case, as in the first embodiment, a high-level driving voltage to be applied by a PCH drive section 3 of a first drive section 2(1) is set to 20V, and a high-level driving voltage to be applied by a PCH drive section 3 of the second drive section 2(2) is set to 15V.

Then, a low potential side terminal NS1 can be connected to the negative side terminal of the external DC power supply 32, and the low potential side terminal NS2 can be connected to a ground terminal GND.

Other Embodiments

The power supply terminals VB1 and VB2 may be used commonly.

Three or more binary level driving sections may be provided and three or more voltage-driven semiconductor elements may be driven.

Each voltage may be appropriately set according to the individual design.

The negative power supply circuit does not necessarily have to variably configure the output voltage.

Further, if there is no need to set the low level driving voltage to a negative voltage, there is no need to provide a level shifter in a low level driving section.

Voltage-driven semiconductor elements are not limited to Si-IGBTs and SiC-MOSFETs.

Although the present disclosure has been described in accordance with the embodiments, it is understood that the present disclosure is not limited to the embodiments and structures.

The present disclosure encompasses various modifications and variations within the equivalent scope.

In addition, various combinations and forms, as well as other combinations and forms including only one element, more than one, or less, in them are also within the scope and idea of the present disclosure.

What is claimed is:

1. A parallel driving circuit, a voltage-driven type semiconductor element of which is to be driven, the parallel driving circuit comprising:
    a high level driving section having a high side switching element connected between a high potential side terminal and a high side driving terminal, and a high side pre-driver capable of changing a high level driving voltage applied to a conduction control terminal of the high side switching element;
    a low level driving section having a low side switching element connected between a low side driving terminal and a low potential side terminal, and a low side driving section having a low side pre-driver which applies a low level driving voltage to a conduction control terminal of the low side switching element;
    a binary level driving section having the high level driving section and the low level driving section, and the low potential side terminal being provided separately from a ground terminal;
    a drive signal generating section that generates drive signals to be outputted respectively to the high side driving section and the low side driving section according to an inputted drive control signal; wherein
    the parallel driving circuit is provided with a plurality of the binary level driving sections.

2. The parallel driving circuit of the voltage-driven type semiconductor element according to claim 1, wherein
    the low level driving section includes:
    a level shifter for shifting a level of an inputted driving signal; and
    a driving power supply which supplies a voltage based on a potential of the low potential side terminal to the low side pre-driver and the level shifter.

3. The parallel driving circuit of the voltage-driven type semiconductor element according to claim 2, wherein
    the parallel driving circuit includes:
    a negative power supply circuit for generating a negative voltage to be supplied as the low level driving voltage; and
    a negative voltage supply terminal to which the negative voltage is supplied.

4. The parallel driving circuit of the voltage-driven semiconductor element according to claim 3, wherein
    the negative power supply circuit is capable of changing the level of the negative voltage.

* * * * *